United States Patent [19]

Lepejian et al.

[11] Patent Number: 5,974,579
[45] Date of Patent: Oct. 26, 1999

[54] EFFICIENT BUILT-IN SELF TEST FOR EMBEDDED MEMORIES WITH DIFFERING ADDRESS SPACES

[75] Inventors: Yervant David Lepejian, Palo Alto, Calif.; Hrant Marandjian; Hovhannes Ghukasyan, both of Yerevan, Armenia; John Caywood, Sunnyvale; Lawrence Kraus, San Jose, both of Calif.

[73] Assignee: Credence Systems Corporation, Fremont, Calif.

[21] Appl. No.: 08/707,062

[22] Filed: Sep. 3, 1996

[51] Int. Cl.⁶ .................................................. G01R 31/28
[52] U.S. Cl. ........................................... 714/733; 365/201
[58] Field of Search ................................. 371/22.5, 21.2, 371/22.33, 22.35, 22.36, 25.1, 27.1, 27.6; 365/201, 189.02, 189.03, 189.06; 364/550; 324/765; 714/25, 29, 30, 32, 44, 718, 720, 721, 733

[56] References Cited

U.S. PATENT DOCUMENTS

| | | | |
|---|---|---|---|
| 4,980,850 | 12/1990 | Morgan | 364/900 |
| 5,175,836 | 12/1992 | Morgan | 395/425 |
| 5,222,066 | 6/1993 | Grula et al. | 371/21.1 |
| 5,377,148 | 12/1994 | Rajsuman | 365/201 |
| 5,412,665 | 5/1995 | Gruodis et al. | 371/27 |
| 5,422,891 | 6/1995 | Bushnell et al. | 371/22.4 |
| 5,574,692 | 11/1996 | Dierke | 365/201 |
| 5,617,531 | 4/1997 | Crouch et al. | 395/183.06 |

Primary Examiner—Robert W. Beausoliel, Jr.
Assistant Examiner—Nadeem Iqbal
Attorney, Agent, or Firm—Smith-Hill and Bedell

[57] ABSTRACT

A built-in self test (BIST) circuit for an integrated circuit tests one or more embedded memories by writing data to each memory address, reading it back out, and then comparing the input and output data to see if they match. The BIST circuit includes one or more data generators for supplying a sequence of data to be written to the various addresses of each memory and one or more identical address generators, each for supplying addresses to a separate embedded memory during read and write operations. Though the memories may have differently sized address spaces, all address generators generate a similar address sequence having a range of address values as large or larger than the address space of the largest memory. During each memory write cycle, a separate filter checks the address output of each address generator to determine whether the address is within the address space of the corresponding memory. If so, the BIST circuit writes the current data output of a data generator to that address of the memory. If not, the BIST circuit ignores the current address and data outputs of the address and data generators and repeats the write operation it performed during a next preceding memory write cycle, writing the same data to the same valid memory address. The BIST circuit makes a similar address substitution during write operation. This allows the BIST circuit to use identical address generators for all memories regardless of the size of the memory being tested.

22 Claims, 5 Drawing Sheets

EFFICIENT BUILT-IN SELF TEST FOR EMBEDDED MEMORIES WITH DIFFERING ADDRESS SPACES

BACKGROUND OF THE INVENTION

The present invention relates to semiconductor integrated circuits and, more particularly, to test circuits built into the integrated circuits that enable efficient testing of embedded memory, especially read/write memory.

As integrated circuits achieve higher and higher levels of integration it is common to find several memory blocks of differing sizes embedded within blocks of logic in the integrated circuit. A typical example of embedded memory is the data and instruction cache memories along with their associated tag and valid data cache memories that are embedded in most modern microprocessors. These memories are called "embedded" because they are not directly accessible from the input and output pins of the integrated circuit chip. Instead, an embedded memory is separated by logic blocks from the input and output pins in ordinary operation of the circuit. Testing of these embedded memories is therefore complicated because any access to these memories during normal operation of the chip is mediated by the associated logic.

Integrated circuits are widely used because they offer a high functionality per unit of cost. To achieve the economies necessary in modern integrated circuit manufacturing, it is necessary to minimize both the cost of the raw circuit as well as the cost of testing it. In many cases, the cost of testing the device is comparable to the cost of manufacturing the raw die in the fabrication plant. The cost of a functional die is roughly proportional to the inverse exponential of the die area. Therefore, it is necessary to minimize the die area in order to minimize die costs. The cost of testing is approximately proportional to the product of the test time and the cost of the testing equipment. Therefore, it is desirable to minimize both the test time and the complexity of the test equipment to minimize testing costs.

Testing of memories is generally accomplished by applying test vectors to the memory and reading back the results to ensure proper memory operation. However, testing an embedded memory through the surrounding logic may require a number of test vectors larger than the available memory available in the automatic test equipment used for testing the device and is, in any case, very time-consuming. It is additionally undesirable because the development of programs to execute such tests require a large amount of skilled test engineering time, which adds to the overhead costs.

Another possible approach to testing embedded memories is to connect the control, address, and data lines of the memories to external pads of the integrated circuit. Multiplexer blocks are implemented within the integrated circuit to connect the embedded memories either to the external pads for testing or to internal buses for standard circuit operation. A drawback to this approach is that the extra bus lines and pads increase the size of the semiconductor die and the extra pads increase the number of pins required of the tester. The cost of the tester is generally roughly proportional to the number of pins. Since the trend is toward wide memories of increasingly large capacity in modern ICs, the number of extra buses and pads required can frequently exceed one-hundred, which represents a prohibitive cost burden.

To avoid excessive costs while simultaneously providing adequate fault coverage, there has been a movement toward built-in self test (BIST) of integrated circuits. This approach relies on circuitry built into the integrated circuit to test the memories and report the results to off-chip electronics by means of a restricted number of pins. An example of BIST methodology are the commonly-used JTAG standards. Special test modes which disable the normal operation of the circuit are invoked to enable BIST.

BIST attempts to provide complete fault coverage while minimizing test time and the area of the die that is occupied by the BIST circuitry. In some applications, it is also desirable that diagnostic information be available for faults that are detected. These requirements are in conflict, so various schemes have been developed which optimize one factor at the expense of the others.

One method for reducing the area on the chip devoted to data buses is to use a serial data-in line and a serial data-out line. Buffers are loaded serially and then used for parallel operation during writing, reading and comparison of the results read from the memory with the stored data. A disadvantage to this approach is that the maximum operational frequency is reduced by the width of the data word (e.g. 32 bits), so that the memory is tested at much less than operational frequency. Thus, faults that appear only at normal speed operation, such as capacitive coupling faults and transition faults, are not detected. Another consequence is that the time needed to test the memory is increased by the time necessary to load the buffers serially. This can increase the test time by a factor approximately equal to the width of the memory words.

Another approach is to add multiplexers to the memory input/output lines such that the data read from the memory can be loaded back into adjacent bits during the subsequent write while the memory is in the test mode. Thus, the data from bit 1 is available for writing into bit 2; the data from bit 2 is available for writing into bit 3; etc. The first bit receives new data and the data output from the last bit is routed back to the finite state machine BIST controller for comparison. In operational mode, the multiplexers connect the memory data lines to the chip data bus. Because data is always available for writing when a read operation is completed, the memory may be tested at operational speeds, which increases the quality and accuracy of the test procedure.

In one possible implementation of the above scheme, the output of the last bit of a word in the first memory is fed into the input of the first bit of a word in the second memory, etc. so as to make all of the memories into effectively one very wide memory for testing purposes. Another implementation involves adding a series of control lines so that each memory can be enabled separately. This allows each memory to be tested sequentially. In the case that the embedded memories are of differing depths, the second method must be used because the first method requires that the memory depths be the same.

There are certain drawbacks to these approaches. For example, although the above implementation offers the advantage of small area utilization, it is nonetheless relatively slow. Furthermore, in the case of a failure, all that is known is the word address of the failure. Information as to which bit failed is not available because the word is structured to operate as a serial shift register with no internal observability. Indeed, in the case that the first proposed method of chaining words in parallel is used, not even the memory that failed can be ascertained. For simple pass or fail testing, it is sufficient to identify that a failure has occurred. However, if redundancy is to be used to repair the failure or if the cause of the failure is to be analyzed, critical information is not available. In fact, if the word were to contain an even number of transition or capacitive coupling faults which cause the bit to read the opposite of the intended data, even the presence of the faults is masked.

An alternate approach is to generate data patterns and address sequences centrally and route them to the embedded memories. This approach is faster than the above serial test approach, especially if several embedded memories are tested in parallel. A drawback to this approach is that routing the extra data and address buses consumes significant amounts of area on the chip as the data path width increases from the historical size of 8 bits to 32 or 64 bits, which are increasingly common. It may not be possible to use the same buses for testing and normal operation because the testing signals should be routed in parallel to the embedded memories while the buses in operation are often separate, e.g. the case of data and instruction caches. This means that testing requires extra buses plus a multiplexer per data and address line.

While parallel testing of embedded memories is desirable from a speed standpoint, different embedded memories (e.g. data cache RAM and the associated tag cache RAM) in an integrated circuit are often not of the same size. If two memories of different sizes are tested by being written with the same data pattern, the data in the smaller memory will be overwritten starting with the lower order address space with the data intended to fill the remaining space in the larger memory if the process of writing to the smaller memory is not inhibited when its address space is exceeded. This situation could easily result in incorrect test results for the smaller memory.

One approach that has been proposed to solve this problem is to use the state of the higher order addresses to inhibit the write signal to the smaller memory, which can be efficient in a few special cases. For example, if one memory is smaller in the row direction and the size of the row address space of the smaller memory is a binary multiple (e.g. $2^k$) of the larger array, OR'ing the higher order row addresses that are unused in the smaller memory provides a simple means of generating the needed inhibit signal. However, for the more general case that the smaller array is of an arbitrary size that is not a binary multiple of the larger array, a magnitude comparator is required which becomes prohibitively complex for larger address spaces and consequently consumes an unacceptably large chip area.

Thus, it is seen from the above that an improved method and apparatus for BIST are needed to test integrated circuits with embedded memories of differing sizes.

SUMMARY OF THE INVENTION

The present invention minimizes the cost and maximizes the effectiveness of BIST by minimizing both the routing area devoted to the test signals and the area devoted to the circuits required to implement the BIST routines while providing the ability to test a plurality of embedded memories at full speed in parallel. Testing the memories at full speed reduces both test time and cost and improves the quality of the testing by providing the ability of detecting transition and capacitively coupled faults.

The routing area devoted to address lines used in accessing the embedded memories is minimized by generating the address locally at each memory with a pseudo-random generator based on a clocked shift register with linear feedback defined by a primitive polynomial. The address routing requires only control signals to the local generators, and the generators themselves are very efficient in terms of layout area and capable of operating at the maximum circuit frequency.

A plurality of embedded memories of differing sizes in an integrated circuit are tested in parallel by controlling and modifying the write address to a smaller-sized embedded memory when the addresses generated by the pseudo-random generator exceed the size of a memory under test. In this manner, a series of address signals which span the address space of the largest embedded memory under test in the integrated circuit can be generated, but the memories with smaller address spaces can be shielded from their effect. The smaller memories will therefore not be overwritten with invalid data, ensuring an accurate test result.

A further understanding of the nature and advantages of the inventions herein may be realized by reference to the remaining portions of the specification and the attached drawings.

DESCRIPTION OF THE PREFERRED EMBODIMENT

Figure 1:
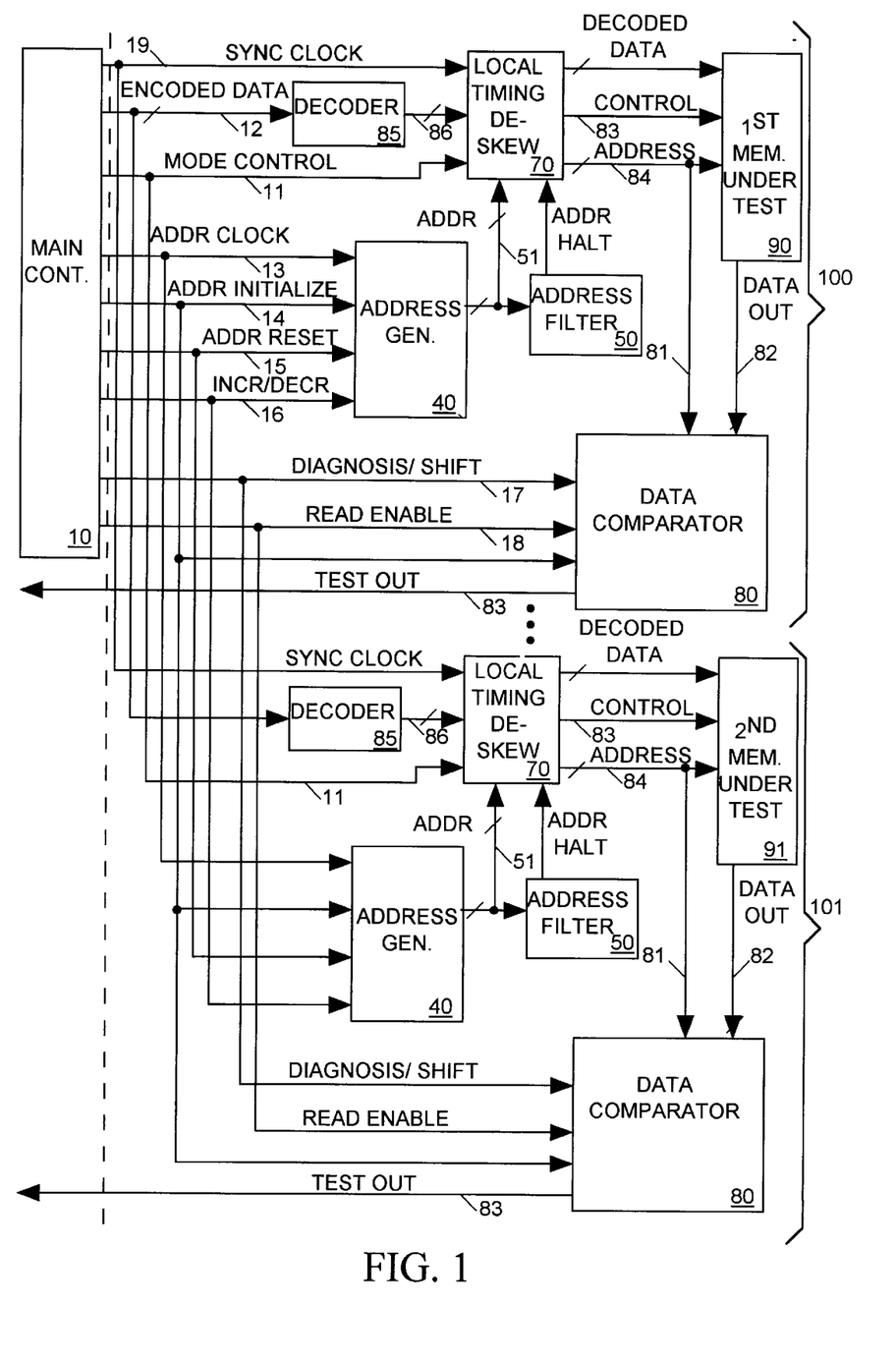
FIG. 1 is a block diagram of the entire BIST circuitry and routing connections of a BIST function according to the present invention.

FIG. 1 shows an overall block diagram of a preferred embodiment of a BIST function according to the present invention. The circuitry for a BIST function such as the one shown in FIG. 1 can typically be generated by a logic synthesizer that receives input files in a high-level design language describing the function to be performed. In FIG. 1, those lines that are actually buses (multiple wires) are indicated by having a diagonal line across them. Main controller 10 controls the testing operation. In a preferred embodiment, there is one main controller 10 in each integrated circuit chip. The remaining set of blocks to the right of the dashed line in the figure are distributed on the order of one full set of blocks per embedded memory array 90 or 91 in the chip that is to be tested. The blocks that are distributed for the BIST function are address generator 40, address filter 50, data decoder 85, data comparator 80 and local timing de-skewing circuit 70, each directly coupled to main controller 10. Note that only one of the lines coupling main controller 10 to the distributed blocks is a bus, specifically encoded data bus 12. Even for this bus, the number of lines in the bus can be shown to be less than or equal to $\log_2$ (number of patterns) for an encoding circuit that properly minimizes the width of the encoded data bus, as shown in related application Ser. No. 08/697,969 (Attorney Docket No. 16079-2), entitled "Efficient Built-in Self Test for Embedded Memories Resulting from Efficient Data Routing," also assigned to the assignee of the present application and incorporated by reference herein. The small number of lines required to be routed is an example of the improved efficiency of the present invention.

Main controller 10 is responsible for coordinating and synchronizing the tests that are conducted on each embedded memory array 90 or 91. Decoder 85 decodes the encoded data on bus 11 from main controller 10 and provides decoded data to local de-skewing circuit 70, which passes the data on decoded data bus 81 to the memory under test. Address generator 40 receives address clock 13, address initialization signal 14, address reset signal 15, and increment/decrement signal 16 from main controller 10 to generate the addresses used in accessing memories 90 and 91. The generated addresses are also provided to de-skewing circuit 70. In a preferred embodiment, address generator 40 is a pseudo-random address generator, as described in further detail below.

Address filter 50 generates the signal to indicate that the bounds of the address space of the smaller embedded memory have been exceeded. Assuming that first memory 90 is larger than second memory 91, address filter 50 generates an address halt signal 52 when the address space of the second (smaller) memory 91 has been exceeded. Address halt signal 52 then freezes address signals 84 and data signals 81 to memory 91 at the last valid address used to access the memory. These signals remain frozen until another valid address (i.e. an address within the address space of the memory) is asserted. Thus, as long as address generator 40 provides addresses outside the address space of a smaller embedded memory, the last valid address location is repeatedly re-written and re-read with the old data appropriate for that location, even as other new data may be written to and read from other address locations in larger embedded memories in the integrated circuit chip. It should be noted that when a pseudo-random approach to address generation is employed, the addresses may well be alternately in and out of the allowed address space for the smaller embedded memory 91. Thus, address filter 50 must respond intelligently to the pseudo-random sequence of addresses so as to lock out only those illegal addresses from the smaller address space.

Local timing de-skewing circuit 70 provides pulse shaping and edge placement for the input signals to each embedded memory array 90 and 91. The signals on address bus 84, control line 83 and decoded data bus 81 exercise embedded memories 90 and 91 by writing and reading from all of the memory locations in both polarities with differing address sequences. De-skewing circuit 70 assures that there are no timing problems associated with accessing different embedded memory arrays 90 or 91 that may be separated by more than a centimeter on the integrated circuit chip.

Data comparator 80 compares the output data 82 from embedded memory 90 or 91 with the corresponding input data 81 and reports the results in a pass/fail format on test output line 19, under the control of diagnosis/shift signal 17 and read enable 18. Should the information be deemed valuable, in an alternate embodiment the addition of two lines would allow the data comparator to report the address location of any failing bits back to main controller 10. This information could then be combined with information regarding pattern and data polarity and be reported to an external tester for further analysis, redundancy repair or other similar actions.

Figure 2:
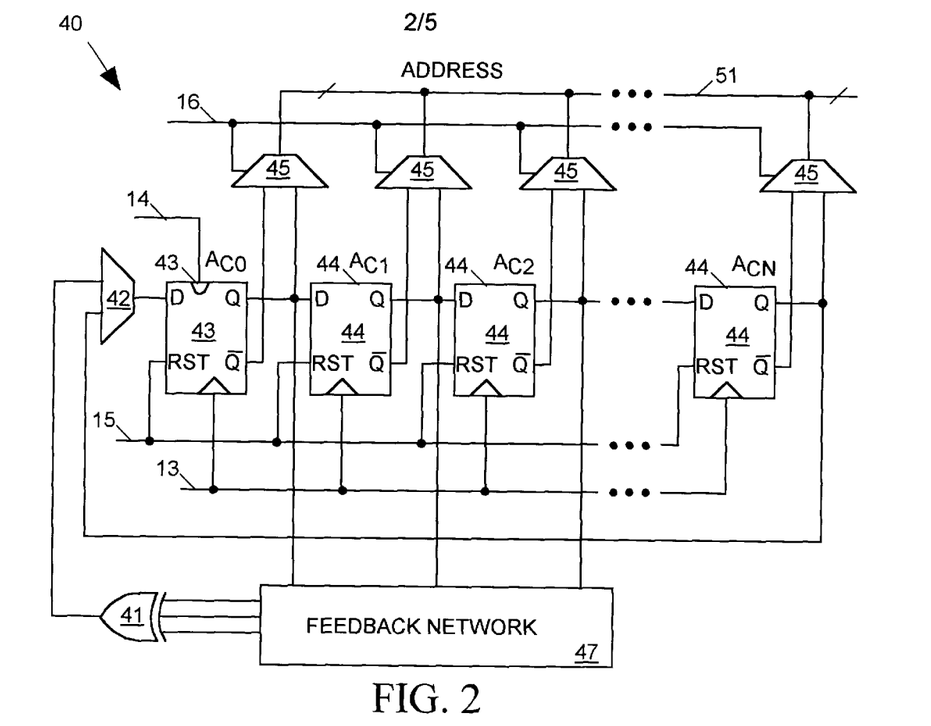
FIG. 2 is logic diagram of a local address generator according to the present invention.

FIG. 2 shows a logic diagram of a preferred embodiment of a pseudo-random address generator 40. Pseudo-random address generator 40 is based on a synchronous shift register with linear feedback. The feedback is determined by a primitive polynomial, and the polynomial order is dependent upon the number of addresses to be generated. The polynomials are well-known in the field and are shown, for example, in the book "Built-in Test for VLSI: Pseudo-random Techniques" by Bardell et al. In operation, address reset signal 15 first resets all the outputs of all flip-flops in the register to "0". An address of zero (all 0's) is thus output on address bus 51, which is not otherwise generated by a pseudo-random generator, other than at reset. Next, address generator 40 is seeded by using address initialize signal 14 to set the $A_0$ flip-flop 43 to "1". $A_0$ flip-flop 43 is chosen for seeding merely by way of example; any of the other flip-flops could have been chosen for seeding the generator, as appropriate. Clocking the shift register with address clock 13 will generate all non-zero addresses exactly once in a pseudo-random order on address bus 51, after which the generation is repeated in the same order, if not interrupted.

Multiplexers 45 are used to determine whether the addresses will be sequenced in incrementing order (i.e. start with "all 0's") or decrementing order (i.e. start with "all 1's") by selecting either the data or complement data output from the flip-flops 43 and 44 with increment/decrement signal 16. Feedback network 47 is connected at the appropriate outputs of flip-flops 43 and 44 to form the desired primitive polynomial. This polynomial feedback loop through the exclusive-OR (XOR) gate 41 permits generation of the pseudo-random sequence of "0's" and "1's" that is shifted through the shift register. The outputs of multiplexers 45 form the lines of address bus 51.

Figure 3:
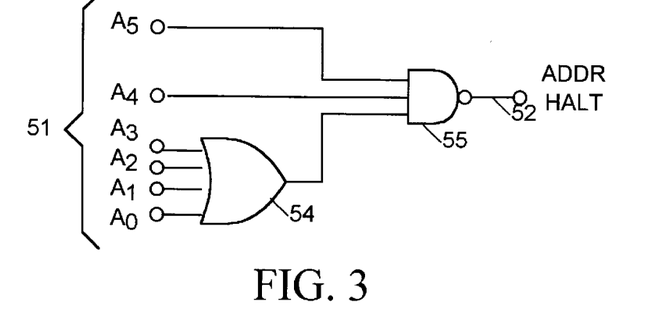
FIG. 3 is a logic diagram of an address filter according to the present invention.

FIG. 3 shows a logic diagram of a sample address filter 50 according to the present invention. Address filter 50 may be generated, for example, by the method described in related application Ser. No. 08/697,968 (Attorney Docket No. 16079-5), entitled "Efficient Filtering of Differing Address Spaces in Built-in Self Test for Embedded Memories," also assigned to the assignee of the present application and incorporated by reference herein. As a simple example, assume that a larger embedded memory in the integrated circuit has 64 address locations, while a smaller embedded memory in the same integrated circuit has 48 address locations. Thus, in this case, address halt signal 52 for the smaller memory must be generated whenever the address value on address bus 51 exceeds 47 (11000 in binary notation). Referring to FIG. 3, then, address halt signal 52 will go low (logical "0") whenever the address on address bus 51 exceeds "110000". This signal serves as an input to local timing de-skewing circuit 70, discussed below.

Figure 4:
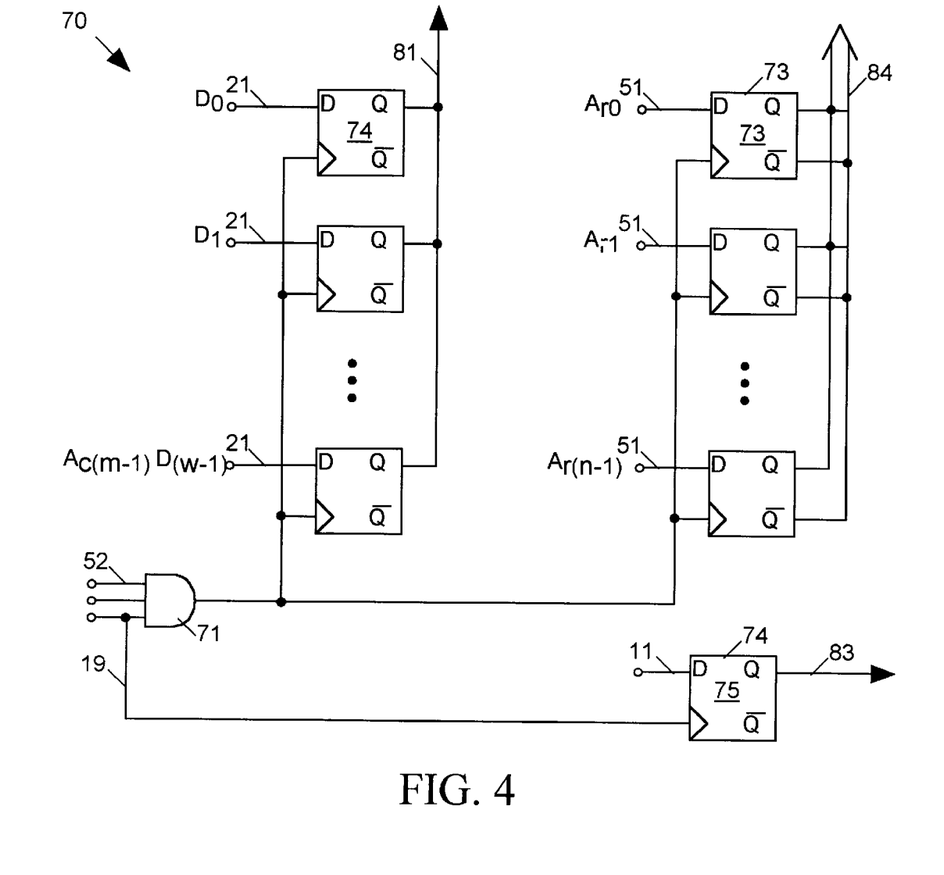
FIG. 4 is a logic diagram of an example of the local timing de-skewing logic according to the present invention.

FIG. 4 shows a simplified circuit diagram of local timing de-skewing circuit 70. De-skewing circuit 70 employs synchronously clocked latches 72 and 73 to provide the de-skewing function, as is common practice in VLSI design. An additional logic element, AND gate 71, inhibits the writing of test data to invalid address locations. As long as address halt signal 52 is high, the output of AND gate 71, which is essentially clock signal 19, continues to propagate control signal 83, address signals 84 and data signals 81 through to the embedded memory under test. However, when address halt signal 52 goes low, signifying an address out of bounds of the address space of a smaller embedded memory 91, the output of AND gate 71 is always low, freezing the outputs of latches 72 and 73 coupled to the data and address lines, respectively. Only control signal 83 is allowed to propagate through latch 74. Thus, reading and writing is restricted to the last valid address before the address space of the smaller memory was exceeded, and the data is threfore rewritten over and over again to the location of the last valid address.

Figure 5:
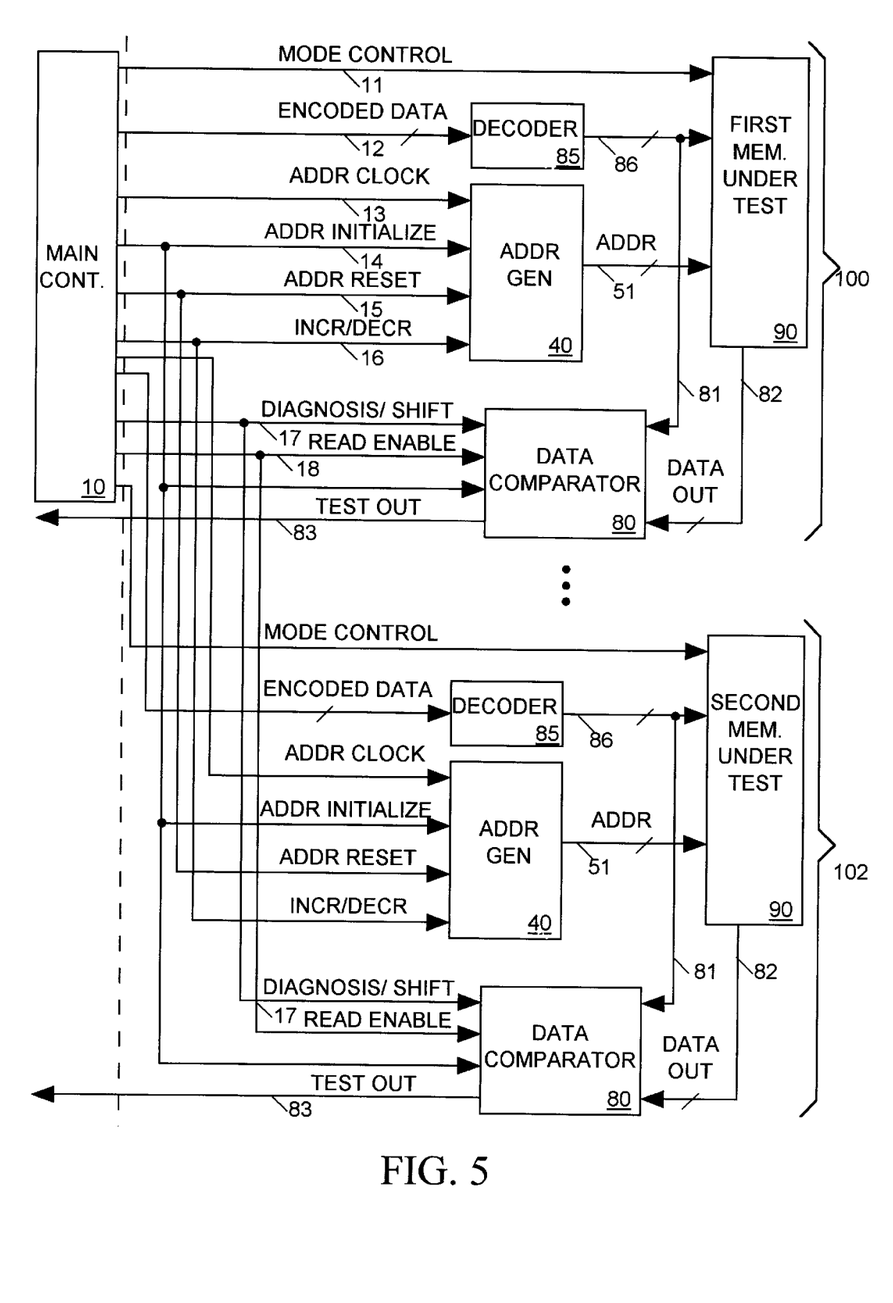
FIG. 5 is a block diagram of the BIST circuitry and routing connections of an alternate embodiment of the present invention.

FIG. 5 shows a simplified block diagram of an alternate embodiment of the present invention. In this embodiment, the sensing and freezing of the address space of a smaller embedded memory is moved from a distributed approach where each memory has its own filter, as described above, to a centralized approach where the filtering function is located only in main controller 10. This approach requires that a separate address clock and encoded data buses be routed to embedded memories with address spaces smaller than that of the largest embedded memory in the integrated circuit. Thus, in FIG. 5, the largest address space memory 90 receives the address clock and encoded data on buses 13 and 12, respectively, whereas the smaller memory 91 receives these signals on separate bus lines 72 and 71, respectively. If more than one smaller embedded memory 91 are of the same size, they can share these separate lines, reducing the wiring overhead. The approach is conceptually similar to the method described above, where the address and encoded data signals are frozen for the smaller address space memory when its address space is exceeded.

Figure 6:
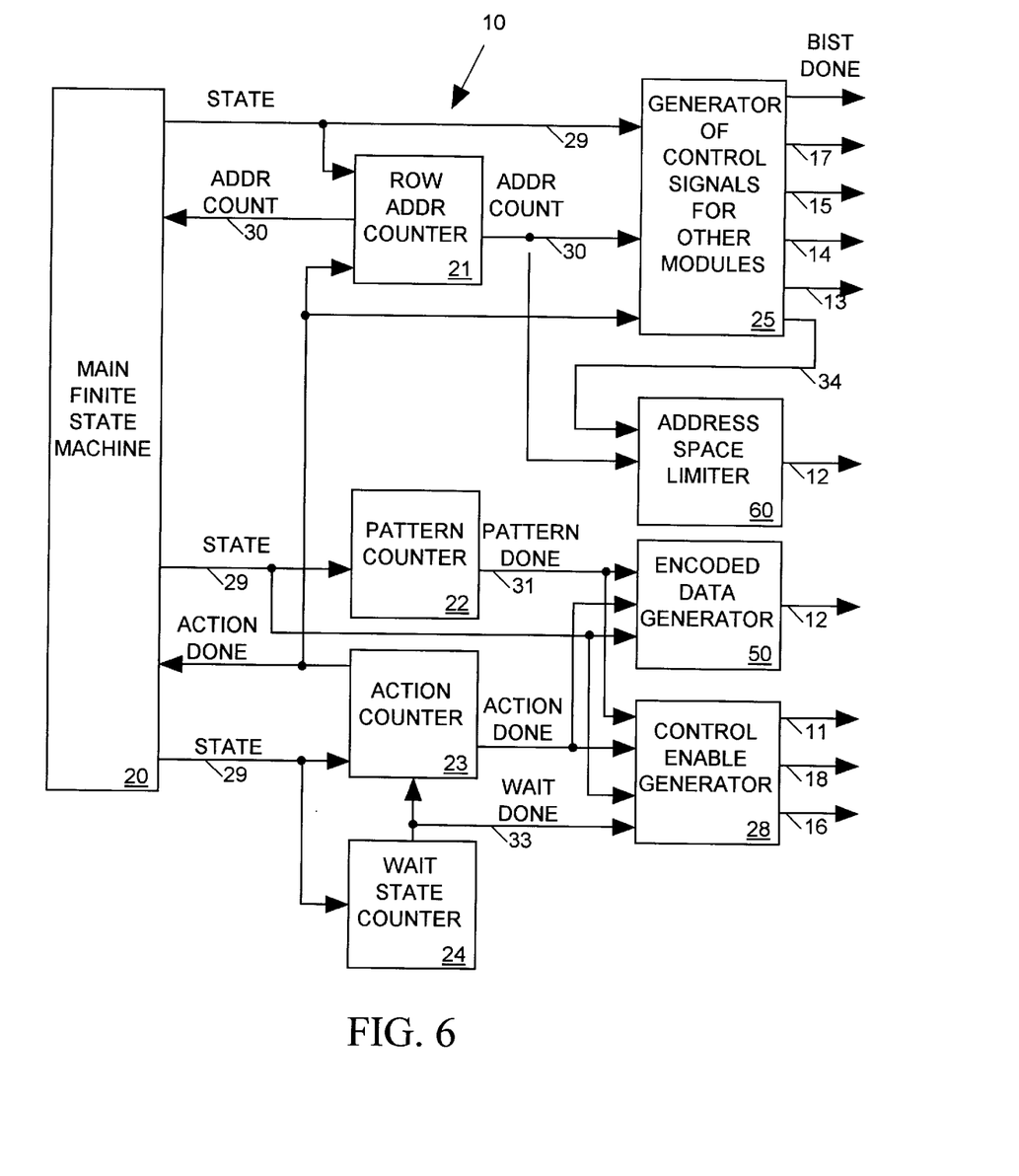
FIG. 6 is a block diagram of the main controller of an alternate embodiment of the present invention.

FIG. 6 shows a block diagram of main controller 10 according to the alternate embodiment of the invention. Encoded data bus 12, address clock 13, address reset signal 15, address count 30 and space limiter clock 34 are routed to address space limiter circuit 60. Space limiter clock 34 has the same frequency as address clock 13 and is phased to precede it. Address space limiter circuit generates encoded data signal 71 and address clock signal 72.

Figure 7:
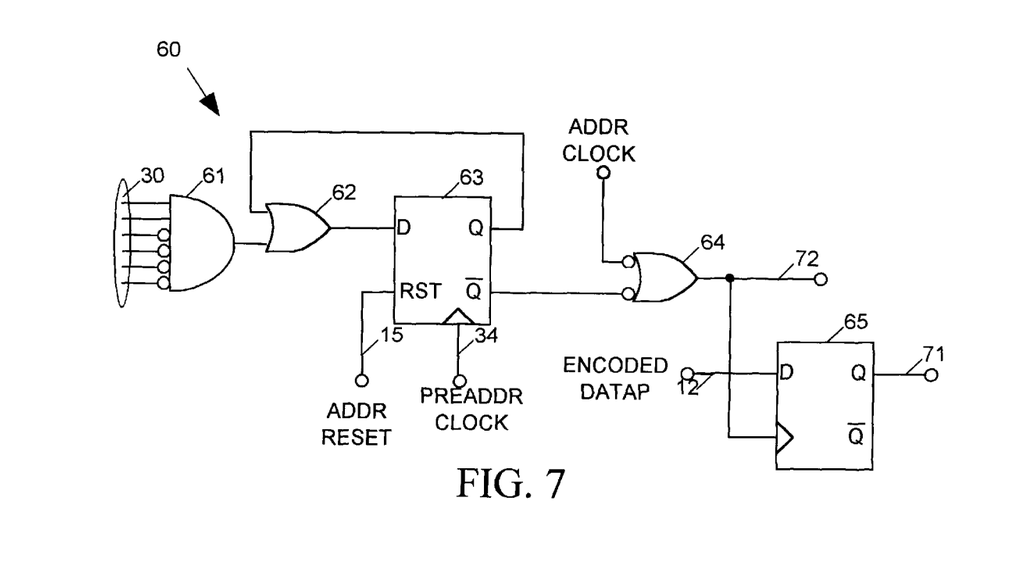
FIG. 7 is a logic diagram of the address space limiter of an alternate embodiment of the present invention.

FIG. 7 shows a simplified block diagram of address space limiter 60. In operation, the output of AND gate 61 is high when address count 30 reaches the limit of the address space of a smaller embedded memory under test 91. FIG. 7 shows an address space of 48 elements merely by way of example. Latch 63 is reset by address reset signal 15 at the beginning of the address sequence so that its output is low. When the output of AND gate 61 is high, indicating the highest possible address in the address space of memory 91, the output of latch 63 also goes high with the subsequent edge of space limiter clock 34. The output of logic gate 64 is low if either input is low. Therefore, until the count is reached, the output of gate 64 follows address clock 13. Once the address count is reached, however, indicating that the limit of the address space of embedded memory 91 has been reached, address clock 72 remains at a constant low level until reset. Since address clock 72 is low, output latch 65 receives no clock signals, which freezes encoded data signal 71 at its last value.

The above description is illustrative and not restrictive. Many variations of the invention will become apparent to those of skill in the art upon review of this disclosure. For example, other data patterns may be used, which would result in different logic diagrams. Moreover, the same logic functions may be realized in a number of ways. The scope of the invention should, therefore, be determined not with reference to the above description, but instead should be determined with reference to the appended claims along with their full scope of equivalents.

What is claimed is:

1. An integrated circuit chip comprising:

a first memory block;

a second memory block having a smaller address space than said first memory block;

control means for performing a parallel write operation by applying a write address and data to said first and second memory blocks; and an address filter coupled to said second memory block for applying a second write address to said second memory block within said smaller address space of said second memory block, when said write address from said control means falls outside said smaller address space of said second memory block.

2. The integrated circuit chip of claim 1 wherein said second write address further comprises a valid address within said smaller address space from an immediately preceding parallel write operation to said first and second memory blocks.

3. The integrated circuit chip of claim 1 further comprising an address generator for generating said write address to access said first and second memory blocks in said parallel write operation.

4. The integrated circuit chip of claim 3 wherein said address generator further comprises an address generator for generating write addresses in a pseudo-random sequence.

5. An integrated circuit chip comprising:

a first memory block;

a second memory block having a smaller address space than said first memory block; and control means for performing a parallel write operation by applying a write address and data to said first and second memory blocks, said control means comprising:

an address filter for applying a second write address to said second memory block within said smaller address space of said second memory block, when said write address from said control means falls outside said smaller address space of said second memory block.

6. The integrated circuit chip of claim 5 wherein said second write address further comprises a valid address within said smaller address space from an immediately preceding parallel write operation to said first and second memory blocks.

7. The integrated circuit chip of claim 5 further comprising an address generator for generating said write address to access said first and second memory blocks in said parallel write operation.

8. The integrated circuit chip of claim 7 wherein said address generator further comprises an address generator for generating write addresses in a pseudo-random sequence.

9. An integrated circuit chip comprising:

a plurality of memory blocks, at least one of said plurality of memory blocks having a smaller address space than the remaining memory blocks;

means for performing a parallel write operation by applying a write address and data to said plurality of memory blocks; and control means, coupled to said means for performing, for applying a second write address to said at least one memory block having a smaller address space within said smaller address space of said at least one memory block, when said write address from said means for performing falls outside said smaller address space of said at least one memory block.

10. The integrated circuit chip of claim 9 further comprising an address filter for filtering out addresses greater than a maximum address in said smaller address space.

11. The integrated circuit chip of claim 10 wherein each of said plurality of memory blocks is coupled to a corresponding address filter.

12. A built-in self test (BIST) circuit for an integrated circuit including at least one addressable embedded memory (90) having an address space spanning a limited range of addresses, the BIST circuit comprising:

an address generator (40) for providing a sequence of addresses including addresses within said address space and addresses not within said address space;

a data source (85) for providing a data value concurrently with each address of said sequence;

memory control means (50,70) for receiving and responding to each concurrently provided address and data by determining whether the address is within the address space of said memory, and by writing the concurrently provided data to that address of said memory only when the address is within the address space of said memory.

13. The BIST circuit in accordance with claim 12 wherein said memory control means (52,70) stores the data most recently written to said memory along with its concurrently provided address".

14. The BIST circuit in accordance with claim 13 wherein when the address output of said address generator exceeds the address space of said memory, said memory control means rewrites its last stored data to said memory as its last stored address.

15. The BIST circuit in accordance with claim 14 wherein said memory control means comprises a digital filter (50) for receiving each provided address and for asserting an output signal (ADDR HALT) whenever a received address is within said address space".

16. The BIST circuit in accordance with claim 15 wherein said memory control means further comprises means (70) for receiving the concurrently provided address and data, for receiving said filter output signal, and for writing the concurrently provided data to the received address of said memory only when the filter output is not asserted and for otherwise rewriting its last stored data to said memory as its last stored address.

17. The BIST circuit in accordance with claim 15 wherein said digital filter comprises a network of logic gates for logically combining bits of each received address to produce said output signal.

18. A built-in self test (BIST) circuit for an integrated circuit including a plurality of addressable embedded memories (90,91) each having a differing address space, the BIST circuit comprising:

a plurality of address generators (40), each corresponding to a separate one of said memories and each concurrently providing an identical sequence of addresses;

a plurality of data sources (85), each corresponding to a separate one of said memories and each providing a data value concurrently with each address provided by the corresponding address generator; and a plurality of memory control means (50,70), each corresponding to a separate memory, for receiving and responding to each address and data concurrently provided by the address generator and data source corresponding to said separate memory by determining whether the address is within the address space of said memory, and by writing the concurrently provided data to that address of said memory only when the address is within the address space of said memory.

19. The BIST circuit in accordance with claim 18 wherein each said memory control means stores the data it most recently wrote to its corresponding memory along with the address concurrently provided with that data.

20. The BIST circuit in accordance with claim 19 wherein when an address provided by any one of said address generators is not within the address space of its corresponding memory, the corresponding memory control means rewrites its last stored data to said memory at its last stored address.

21. The BIST circuit in accordance with claim 18 wherein each memory control means comprises:

a digital filter (50) for receiving each address provided by a corresponding address generator and for asserting an output signal (ADDR HALT) whenever a received address is not within said address space, and means (70) for receiving each address and data provided to said memory control means, for receiving the filter output signal, and for writing the received data to said memory at said received address only when said filter output signal indicates the received address is within the address space of said memory.

22. The BIST circuit in accordance with claim 21 wherein said digital filter comprises a network of logic gates for logically combining bits of each received address to produce said output signal.

* * * * *